United States Patent [19]

Tojo et al.

[11] Patent Number: 4,984,890
[45] Date of Patent: Jan. 15, 1991

[54] METHOD AND AN APPARATUS FOR ALIGNING FIRST AND SECOND OBJECTS WITH EACH OTHER

[75] Inventors: Toru Tojo, Kanagawa; Osamu Kuwabara, Yokohama; Masashi Kamiya; Hisakazu Yoshino, both of Tokyo, all of Japan

[73] Assignees: Kabushiki Kaisha Toshiba, Kawasaki; Tokyo Kogaku Kikai Kabushiki Kaisha, Tokyo, both of Japan

[21] Appl. No.: 453,856

[22] Filed: Dec. 20, 1989

Related U.S. Application Data

[63] Continuation of Ser. No. 251,842, Sep. 30, 1988, Pat. No. 4,902,133.

[30] Foreign Application Priority Data

Sep. 30, 1987 [JP] Japan .............................. 62-246202

[51] Int. Cl.$^5$ .............................................. G01B 4/02
[52] U.S. Cl. ..................................... 356/356; 356/363; 356/401
[58] Field of Search ................. 356/356, 363, 400, 401

[56] References Cited

U.S. PATENT DOCUMENTS

| | | | |
|---|---|---|---|
| 4,631,416 | 12/1986 | Trutna, Jr. ..................... | 356/400 X |
| 4,815,850 | 3/1989 | Kanayama et al. ............. | 356/356 X |
| 4,902,133 | 2/1990 | Tojo et al. ...................... | 356/356 |

*Primary Examiner*—Davis L. Willis
*Assistant Examiner*—Matthew W. Koren
*Attorney, Agent, or Firm*—Oblon, Spivak, McClelland, Maier & Neustadt

[57] ABSTRACT

A distance between a mask and a wafer is set such that exposure light beams emerged from the mask are converged by the projection lens to be focused on the wafer. Two light beams with same wavelength of the alignment light beam emerge from a first point (b) which is located far away from the mask, and are focused on the wafer or neighborhood of it by the projection lens. Two mask marks of diffraction gratings are formed on the mask and spaced at a predetermined distance from each other. When the alignment light beams are applied to the mask marks, two diffracted light beams of predetermined order emerge individually from the mask marks in such a manner that the respective optical axes of the two diffracted light beams, which are directed oppositely to of the diffracted light beams, intersect each other on the first point. Thus, the diffracted light beams advance as if the diffracted light beams were the two light beams emerging from the first point. Therefore, the two diffracted light beams can be focused on the wafer or neighborhood of it or can be incident on a wafer mark which is a diffraction grating. Thus, rediffracted light beams emerge from the wafer mark and are detected, so that the mask and the wafer are aligned with each other. Accordingly, the alignment can be performed, despite a great diffraction between the wave-lengths of the exposure light beam and the alignment light beam.

24 Claims, 7 Drawing Sheets

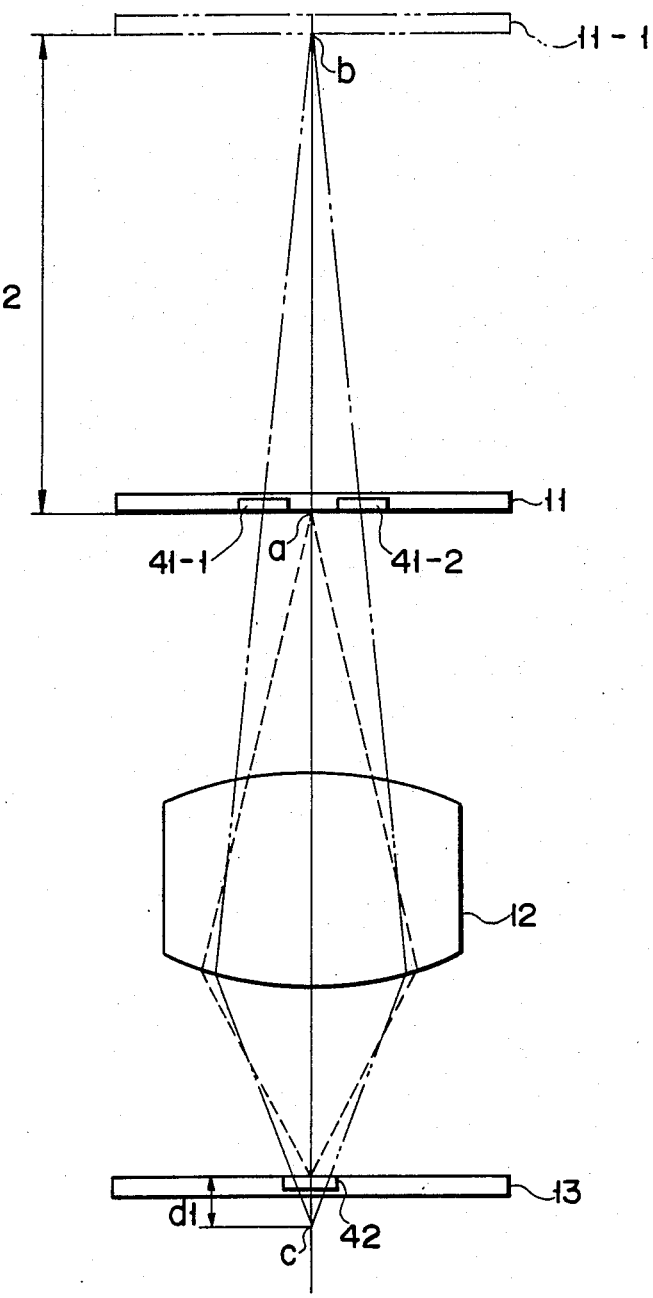
F I G. 5

METHOD AND AN APPARATUS FOR ALIGNING FIRST AND SECOND OBJECTS WITH EACH OTHER

This is a continuation of application Ser. No. 07/251,842, filed on Sept. 30, 1988, now U.S. Pat. No. 4,902,133.

BACKGROUND OF THE INVENTION

1. Field of the Invention

The present invention relates to a method and an apparatus for aligning first and second objects with each other, and more particularly, to a method and an apparatus for aligning a mask and a wafer with each other during a projection/exposure process in the manufacture of semiconductor devices.

2. Description of the Related Art

In a projection/exposure process in the manufacture of a semiconductor device, an exposure light beam emitted from light source 1 is applied to a circuit pattern previously formed on mask 2, as shown in FIG. 1. An image of the circuit pattern is projected on wafer 4 after being reduced in size by means of projection lens 3. Thereupon, a resist of wafer 4 is exposed, so that the pattern image is transferred to wafer 4.

In order to transfer the image of the circuit pattern accurately to a predetermined portion of the wafer, the mask and wafer must be aligned with each other before the exposure light beam is applied to the mask. The TTL (through the lens) method is a major aligning method for this purpose. This method is characterized in that an alignment light beam, which has a wavelength different from that of the exposure light beam, is transmitted through projection lens 3. A method using two diffraction gratings is stated in some documents (by G. Dubroeucq, 1980, ME; W. R. Trutna Jr., 1984, SPIE), as an example of the TTL method. As shown in FIG. 2, diffraction gratings 5 and 6 are formed on mask 2 and wafer 4, respectively. An alignment light beam emitted from alignment light source (laser light source) 7 is diffracted along a path from diffraction grating 6 of the wafer to diffraction grating 5 of the mask. The intensity of the diffracted light beam is detected by means of detector 8. Since the diffracted light beam carries information on dislocation between the mask and wafer, the position of the wafer relative to the mask is detected as the intensity of the diffracted light beam changes.

It is to be desired that the wire of the circuit pattern should be as thin as possible, that is, resolution $R = \propto \lambda/NA$ should be minimized ($\lambda$: wavelength of the exposure light; $NA = \sin\alpha$, where $\alpha$ is half the angle at which the exposure light beam is converged on the wafer). Resolution R can be lessened by widening angle $\alpha$ or reducing $\lambda$. Due to structural restrictions on the projection lens, however, half-angle $\alpha$ cannot be unlimitedly increased. It is advisable, therefore, to reduce wavelength $\lambda$ of the exposure light beam. Presently, a g-line light beam (436 nm) is utilized as the exposure light beam. For a thinner circuit pattern wire, however, an i-line light beam (365 nm) or Krf excimer laser beam (248 nm) is expected to be used as the exposure light beam in the future.

The resist of wafer 4 is sensitive to a light beam with a wavelength of 500 nm or less. Accordingly, a light beam with a wavelength exceeding 500 nm is used as the alignment light beam, in order to avoid affecting the resist. Currently, an He-Ne laser beam of 633-nm wavelength is the most prevalent light beam for the purpose. Even at present, therefore, the exposure light beam and the alignment light beam have different wavelengths. The difference between the two wavelengths, however, is expected to be increased in the future.

Meanwhile, the image of the circuit pattern should be formed focused on the wafer for accurate exposure thereon. Thus, the distance between the mask and wafer is set so that the exposure light beam from the mask can be converged by the projection lens to be focused on the wafer. In other words, the aberration of the projection lens is adjusted so as to be minimized only for the exposure light beam, that is, the projection lens has chromatic aberration for light beams of any other wavelengths than that of the exposure light beam.

In aligning the mask and wafer with each other, therefore, the diffracted alignment light beam from the mask cannot be focused on the wafer, and instead, is focused on a point at distance d from the wafer, as shown in FIG. 2. If a g-line beam (436 nm) is used as the exposure light beam, the distance between the mask and wafer ranges from about 600 mm to 800 mm, while distance d is only scores of millimeters.

Conventionally, ordinary engineers believes that the sensitivity of diffracted light beams to be detected is too low for a mask and a wafer to be aligned accurately with each other, unless the diffracted alignment light beam is focused on a mask mark. Therefore, prior art aligning apparatuses are provided with means for correcting the length of the optical length of the diffracted alignment light beam, as shown in FIG. 2. More specifically, return mirrors 9 are disposed in the middle of the path of the diffracted alignment light beam. The optical path of the diffracted alignment light beam is extended by the distance for which the diffracted alignment light beam passes between mirrors 9, so that the diffracted alignment light beam from the mask can be focused on the wafer. If the aligning apparatus is provided with such correction means, however, the apparatus will inevitably be complicated in construction.

If a Krf excimer laser beam, whose wavelength is extremely short (248 nm), is used as the exposure light beam, moreover, the difference between the wavelengths of the exposure light beam and the alignment light beam is very large. Therefore, the diffracted alignment light beam is focused on a point at distance D (several thousands of millimeters) from the wafer, as shown in FIG. 2. In this case, the return mirrors must be positively increased in size or complicated in construction, in order to correct the length of the optical path of the alignment light beam. Practically, therefore, it is impossible to correct to the optical path length by means of the return mirrors. Thus, if the wavelength of the exposure light beam is very short (i.e., if there is a great difference between the wavelengths of the exposure light beam and the alignment light beam), the mask and wafer conventionally cannot be aligned with each other.

SUMMARY OF THE INVENTION

The object of the present invention is to provide a method and an apparatus for highly accurately aligning first and second objects with each other by means of a simple arrangement, in a system such that a projection lens is interposed between the first and second objects, whereby a light beam with a wavelength different from that of an alignment light beam is transmitted through the projection lens to be incident upon the second object, thereby forming an image of the first object thereon.

More specifically, the object of the invention is to provide a method and an apparatus capable of accurately aligning a mask and a wafer with each other by means of a simple arrangement, despite a great difference between the wavelengths of an exposure light beam and an alignment light beam.

According to the present invention, there is provided a method for aligning first and second objects with each other, which objects are moved relative to each other and in parallel, so as to be aligned, a projection lens being disposed between the first and second objects, a first mark formed on the first object, the first mark including a diffraction grating region having two diffraction points, each capable of diffracting a light beam applied thereto, the two diffraction points spaced at a predetermined distance from each other, a second mark formed on the second objects, the second mark including a diffraction grating region, the method comprising steps of:

directing an alignment light beam emitted from a light source to the first mark, the alignment light beam diffracted by the two diffraction points of the first mark, so that two diffracted light beams or predetermined orders emerge individually from the two diffraction points in such a manner that the respective optical axes of the two predetermined-order diffracted light beams, which are directed opposite to the advancing direction of the diffracted light beams, intersect each other on a first intersection point at a predetermined distance from the first mark;

transferring the two predetermined-order diffracted light beams through the projection lens toward the second mark, so that the two diffracted light beams are converged by the projection lens and are incident on the diffraction grating region of the second mark in such a manner that the respective optical axes of the two diffracted light beams, which are directed to the advancing direction of the diffracted light beams, intersect each other on a second intersection point at a predetermined distance ($=d_1 \geq 0$) from the second mark, whereby the two diffracted light beams are diffracted by the diffraction grating region of the second mark, and two re-diffracted light beams of predetermined orders emerge from the diffraction grating region of the second objects;

detecting the predetermined-order re-diffracted light beams and generating a detection signal; and adjusting the first and second objects relative to each other in response to the detection signal, thereby aligning the first and second object with each other.

BRIEF DESCRIPTION OF THE DRAWINGS

FIG. 5 is a diagram for illustrating the principle of the aligning apparatus of the invention shown in FIG. 4;

DETAILED DESCRIPTION OF THE PREFERRED EMBODIMENTS

It has conventionally been believed that a diffracted alignment light beam emitted from one alignment mark must be focused on the other alignment mark. However, the inventors hereof have found that this is not indispensable. Prior to a description of the present invention, a preliminary invention based on this finding will be explained.

Figure 2:
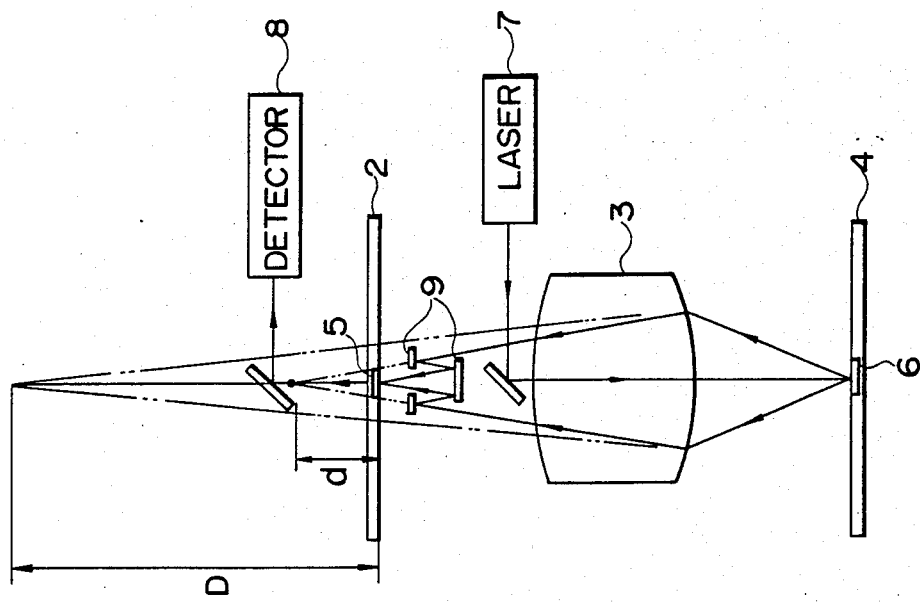
FIG. 2 is a schematic view of a prior art aligning apparatus used in the projection/exposure unit shown in FIG. 1.
Figure 1:
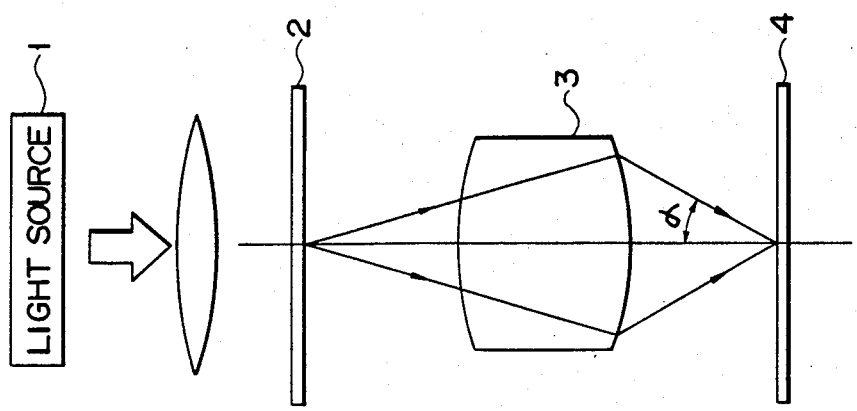
FIG. 1 is a schematic view of a projection/exposure unit.
Figure 3:
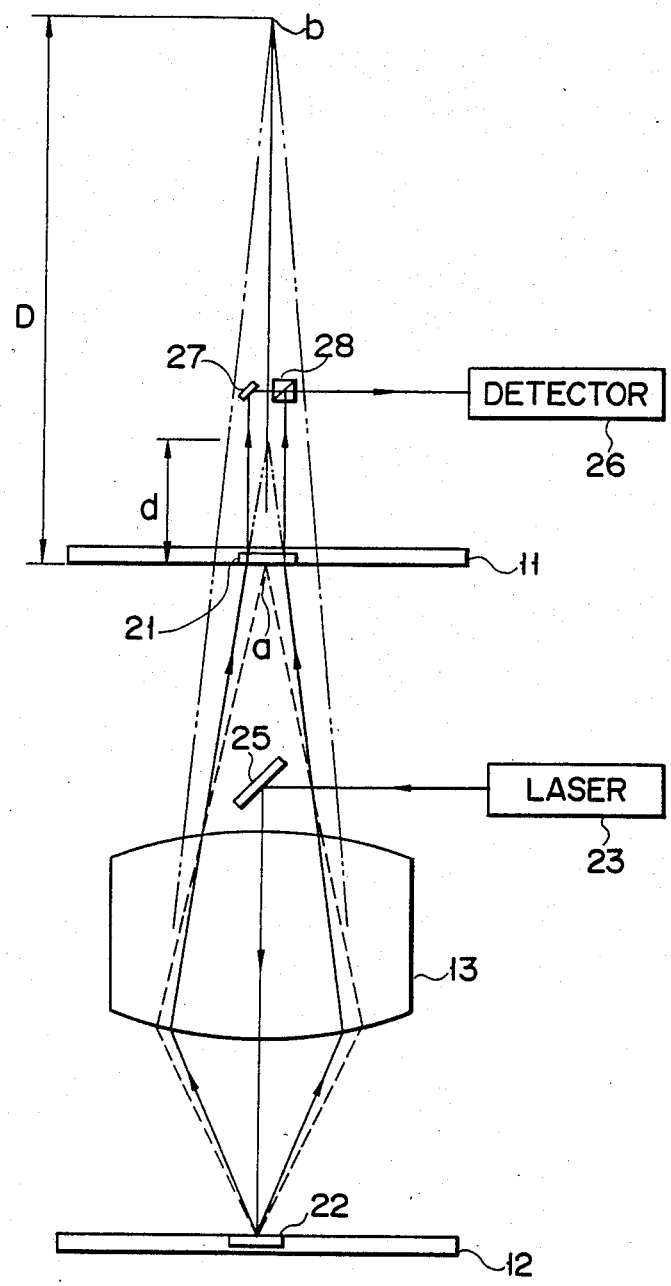
FIG. 3 is a schematic view of an aligning apparatus according to a preliminary invention precedent to the present invention.

As shown in FIG. 3, an alignment light beam emitted from laser 23 is applied to wafer mark (diffraction grating) 22 via mirror 25 and projection lens 13. As a result, n-order diffracted light beams emerge from mark 22. If the exposure light beam is a g-line (436 nm), two ±1-order diffracted light beams of the n-order diffracted light beams are converged by lens 13 to be focused on a point at distance d (several tens of millimeters) from mask mark (diffraction grating) 21. These light beams are spaced at a predetermined distance when they are incident upon mark 21. The two ±1-order diffracted light beams are individually transmitted through mark 21 to be diffracted thereby, so that two ±1-order re-diffracted light beams emerge. These re-diffracted light beams are transferred to detector 26 via mirror 27 and prism 28. In the meantime, the diffracted light beams are superposed to interfere with each other, thus forming an interference light beam, that is, an interference fringe. The intensity change of the interference light beam is detected by means of detector 26. The ±1-order diffracted light beams diffracted by wafer mark 22 carry position information based on the their phase change. The ±1-order re-diffracted light beams diffracted by mask mark 21 carry information on the respective positions a mask and a wafer, based on their phase change. Accordingly, the interference light beam carries information on the mask and wafer positions. Thus, the relative positions of the mask and wafer can be determined by detecting the intensity change of the interference light beam. The mask and wafer are aligned with each other in accordance with the result of the detection.

Even though the ±1-order diffracted light beams diffracted by wafer mark 22 are not focused on mask mark 21, therefore, the mask and wafer can be aligned with each other.

When using a Krf excimer laser (248 nm) as the exposure light beam, however, its wavelength is considerably different from that of the alignment light beam (633 nm). As shown in FIG. 3, therefore, the alignment light beam is focused on point b at distance D (several thousands of millimeters) from mask mark 21. Accordingly, the two ±1-order diffracted light beams diffracted by wafer mark 22 are spaced at so long a distance from each other, at the position corresponding to mask mark 21, that they cannot be incident upon mark 21. If the mask mark is increased in size, however, the detection of the diffracted light beams is liable to err. Thus, even according to the preliminary invention by the inventors hereof, the mask and wafer cannot be aligned with each other if the wavelength of the exposure light beam is extremely short.

Thereupon, the inventors hereof have completed the present invention as described below. According to this invention, the mask and wafer can be aligned with high accuracy even if there is a great difference between the respective wavelengths of the exposure light beam and the alignment light beam.

Figure 4:
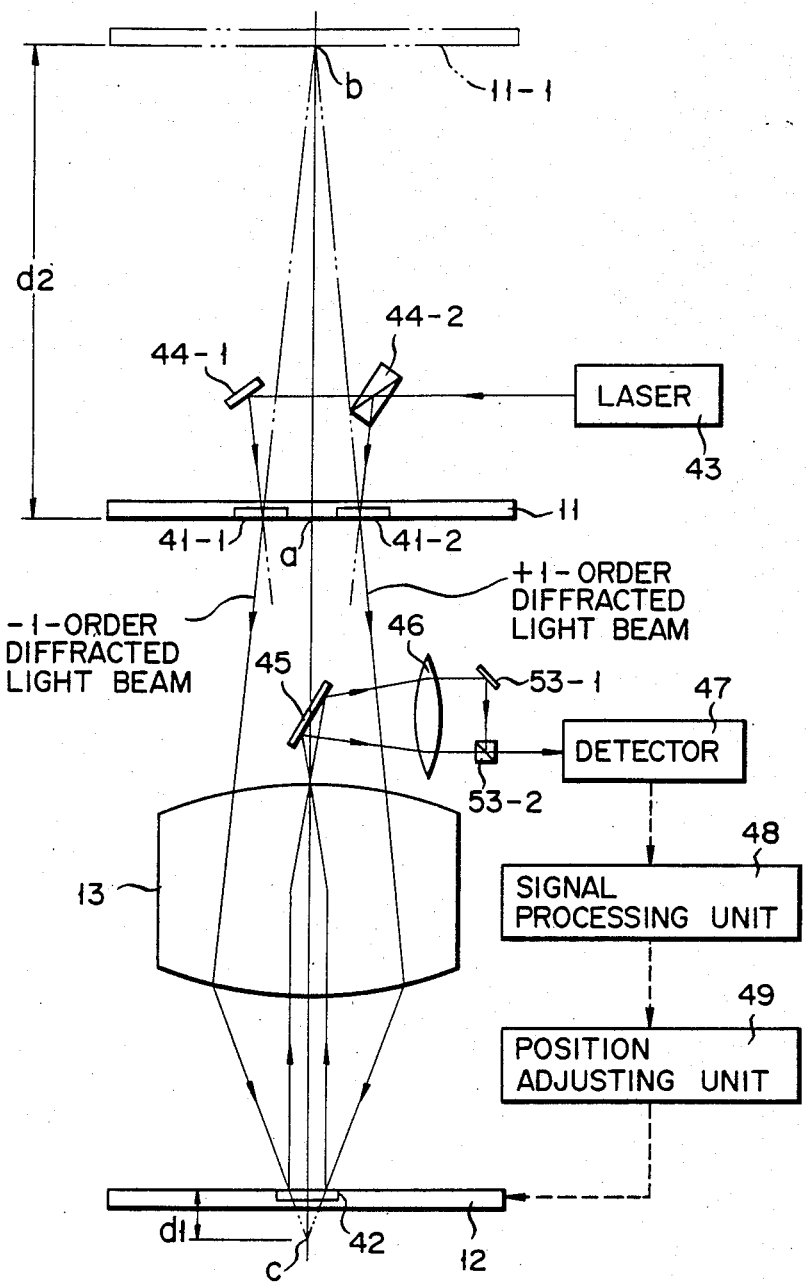
FIG. 4 is a schematic view of an aligning apparatus according to a first embodiment of the present invention.

Referring now to FIGS. 4 and 5, a first embodiment of the present invention will be described.

An aligning apparatus is constructed as follows. Two mask marks 41-1 and 41-2, each composed of a diffraction grating, is formed on mask 11. These marks are spaced at a shown predetermined distance from each other. Each mask mark may be a one- or two-dimensional or checkered diffraction grating. One wafer mark 42, composed of a diffraction grating, is formed on wafer 12. Mark 42 may also be a one- or two-dimensional or checkered diffraction grating.

In the aligning apparatus according to this embodiment, in contrast with the case of the conventional apparatus, the optical path of the alignment light beam extends from laser 43 to detector 47 via mask marks 41-1 and 41-2, projection lens 13, and wafer mark 42, in the order named. Thus, the alignment light beam emitted from laser 43 is split into two light beams by mirror 44-1 and prism 44-2, and the split beams are transferred to marks 41-1 and 41-2, individually. Thereupon, the two light beams are transmitted individually through mask marks 41-1 and 41-2 to be diffracted thereby, so that two n-order (n=0, ±1, ...) diffracted light beams emerge. The two diffracted light beams of the predetermined orders are transferred to wafer mark 42 through projection lens 13. Then, these light beams are individually reflected by mark 42 to be diffracted thereby, so that two n-order re-diffracted light beams emerge. The re-diffracted light beams of the predetermined orders are transferred to detector 47 via mirror 45, lens 46, mirror 53-1 and prism 53-2. Then, re-diffracted light beams are converted into detection signals by detector 47. These detection signals are processed by means of signal processing unit 48. In response to an output signal from unit 48, the position of the mask or the wafer is adjusted by means of position adjusting unit 49.

Comparing FIGS. 3, 4 and 5, the principle of the present invention will now be described.

If the exposure light beam is a Krf excimer laser, as shown in FIG. 3, the diffracted light beams from wafer mark 22 are focused on point b at distance D (several thousands of millimeters) from the mask, as mentioned before. When two light beams having the same wavelength as the alignment light beam emerge from point c at distance dl (several tens of millimeters) from the wafer, therefore, they are focused on point b at distance $d_2$ $$\left( \approx D - \frac{1}{\beta^2} d_1 \right)$$

from the mask, as shown in FIG. 5 ($\beta$ is the inverse magnification of the projection lens for the alignment light beam).

Here let it be supposed that imaginary mask 11-1 is disposed at point b. If two light beams emerge from point b on mask 11-1, they are focused on point c. In the present invention, two mask marks 41-1 and 41-2 are situated on the respective optical paths of these light beams, individually. Thus, marks 41-1 and 41-2 are spaced at a predetermined distance so that the two light beams pass them separately. Therefore, if the respective optical axes of the two diffracted light beams of the predetermined orders, diffracted by mask marks 41-1 and 41-2, are set so as to intersect each other on point b on imaginary mask 11-1, the diffracted light beams are transferred along the optical paths of the light beams from point b to wafer mark 42. The two predetermined order diffracted light beams include a $-1$-order diffracted light beam diffracted by mask mark 41-1 and a 1-order diffracted light beam diffracted by mask mark 41-2.

Wafer mark 42 is also situated on the respective optical paths of the two light beams emerging from point b. Accordingly, the two ±1-order diffracted light beams from the mask marks are spaced at a predetermined distance when they are incident upon mark 42. These diffracted light beams are reflected by the wafer mark to be diffracted thereby, so that two n-order re-diffracted light beams emerge. Thus, ±1-order re-diffracted light beams of two n-order re-diffracted light beams emerge at right angles to the wafer mark. The re-diffracted light beams are converged by projection lens 13, are reflected by mirror 45, and then advance in parallel by means of lens 46. The re-diffracted light beams are transferred to detector 47 via mirror 53-1 and prism 53-2. As in the case of FIG. 3, the diffracted light beams interfere with each other, thus forming an interference light beam, that is, an interference fringe. The intensity change of the interference light beam is detected by means of detector 47. This intensity corresponds to dislocation between the mask and wafer. Based on the detection result of the intensity change of the interference light beam, therefore, position adjusting unit 49 adjusts the position of the mask or wafer.

Thus, according to the first embodiment, the two ±1-order diffracted light beams diffracted by the two mask marks are supposed to be light beams emerging from imaginary mask 11-1. Accordingly, the diffracted light beams from mask marks are focused on point c at a relatively short distance from a focal surface of the wafer, so that they can be incident upon the wafer mark. Even if the wavelength of the exposure light beam is extremely short, as in the case of the Krf excimer laser, for example, the mask and wafer can be aligned with each other, based on the above-described principle of the present invention. Unlike the case of the conventional arrangement, moreover, return mirrors for correcting the optical paths of the diffracted light beams need not be disposed between the mask and wafer. Thus, the arrangement between the mask and wafer is simplified.

Figure 6:
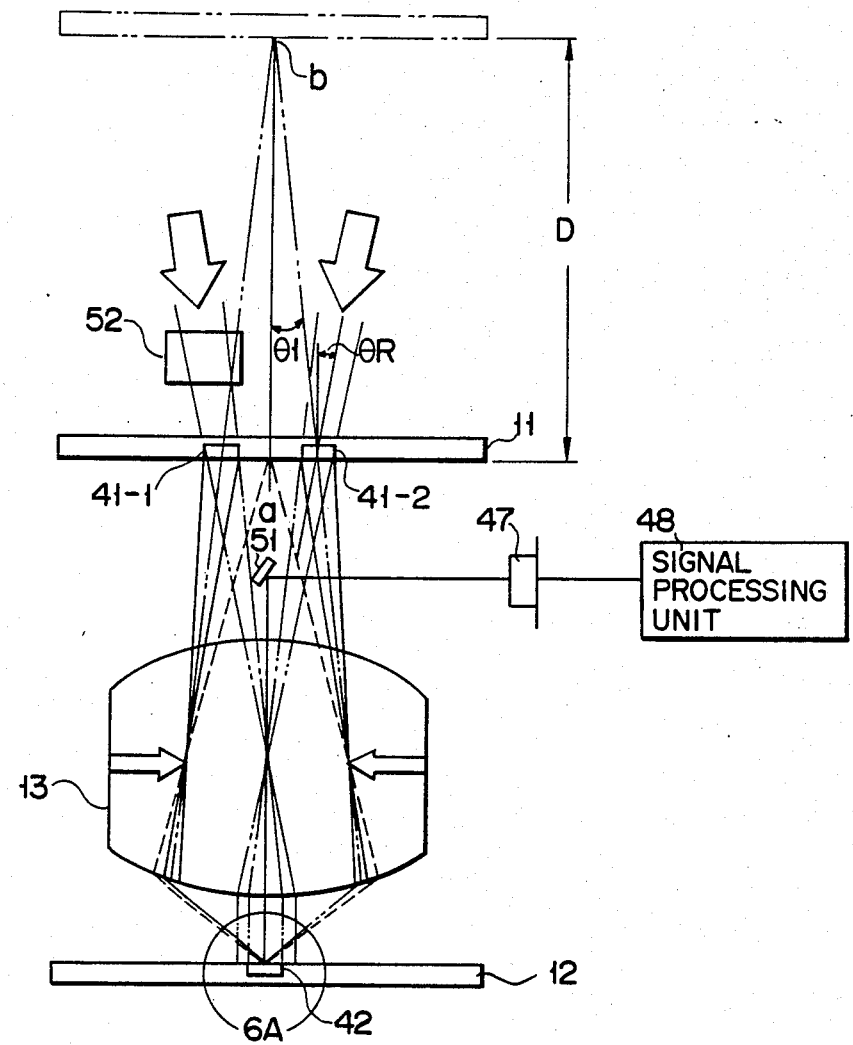
FIG. 6 is a schematic view of an aligning apparatus according to a second embodiment of the present invention.
Figure 6A:
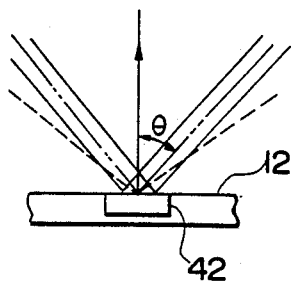
FIG. 6A is a partial enlarged view of the aligning apparatus shown in FIG. 6.

Referring now to FIG. 6, a second embodiment of the present invention will be described.

As shown in FIG. 6, the second embodiment resembles the first embodiment in that two ±1-order diffracted light beams from two mask marks are transferred to wafer mark 42 as if they were light beams emerging from imaginary mask 11-1. The second embodiment, however, differs from the first embodiment in that the ±1-order diffracted light beams from the mask marks are focused on the wafer mark, that is, they are converged on one point on the wafer mark. To meet with this, imaginary mask 11-1 is situated at distance D $$\left( \approx d_2 + \frac{1}{\beta^2} d_1 \right)$$

from mask 11.

More specifically, two alignment light beams, in the form of spherical waves, are illuminated to two mask marks 41-1 and 41-2, individually, in a manner such that they are collected in a incidence pupil of projection lens 13. The alignment light beams are diffracted by the two mask marks, and two n-order diffracted light beams emerge to carry mask position information based on their phase change. Two 0-order diffracted light beams enter the incidence pupil of lens 13. A −1-order diffracted light beam from mask mark 41-1 and a +1-order diffracted light beam from mask mark 41-2 are transferred to lens 13 as if they were light beams emerging from b point of imaginary mask 11-1. The two ±1-order diffracted light beams take the form of plane waves after they are transmitted through the projection lens. These two diffracted light beams, in the form of plane waves, are converged on one point on wafer mark 42, whereupon they interfere with each other, thus forming an interference fringe. This interference fringe is a moiré pattern, a periodic pattern, which depends on angle $\theta$. Here $\theta$ is an angle value half that of the angle formed between the ±1-order diffracted light beams converged on the wafer mark.

The two interfering ±1-order diffracted light beams are reflected by wafer mark 42 to be diffracted thereby again, and ±1-order re-diffracted light beams emerge. This ±1-order re-diffracted light beams each other, are reflected perpendicularly by mark 42, and are then applied to detector 47 via mirror 51. Since the ±1-order re-diffracted light beams are interference light beams, information on the respective positions of the mask and wafer can be obtained by detecting their intensity change. Thereafter, the mask and wafer are aligned with each other in the same manner as in the first embodiment.

Thus, also in the second embodiment, the mask and wafer can be aligned with each other even if the wavelength of the exposure light beam is extremely short, that is, even though the respective wavelengths of the exposure light beam and the alignment light beam are considerably different. In contrast with the case of the conventional arrangement, moreover, return mirrors for correcting the optical paths of the diffracted light beams need not be disposed between the mask and wafer. Thus, the arrangement between the mask and wafer is simplified.

Further, according to this embodiment, the two ±1-order order diffracted light beams from the mask marks are converged on one point on wafer mark 42, where they interfere with each other. In contrast with the case of the first embodiment, therefore, the re-diffracted light beams from the wafer mark need not be superposed. Thus, there is no need of means for superposing the re-diffracted light beams.

In the first embodiment, furthermore, the wafer mark sometimes may be skewed, failing to be set horizontally, if the wafer is distorted. Since the two ±1-order diffracted light beams are separate from each other when they are incident upon the wafer mark, the re-diffracted light beams from the wafer mark may possibly be reflected slantly, not vertically. Therefore, the alignment between the mask and wafer may be subject to an error. According to the second embodiment, however, the two ±1-order diffracted light beams are converged on one point of the wafer mark, so that there is no possibility of such an error. In the case of the first embodiment, moreover, the re-diffracted light beams may be changed in phase if there is a difference between the ambient temperatures around the −1− and +1-order re-diffracted light beams. Thus, the alignment may possibly be subject to an error. According to the second embodiment, however, the re-diffracted light beams cannot be changed in phase.

The following is a description of the ways of setting distance D between imaginary mask 11-1 and mask 11, the distance between mask marks 41-1 and 41-2, and the pitch of the mask marks.

Let it be supposed that the inverse magnification of the projection lens for the alignment light beam, indicative of the relation between the respective positions of the imaginary mask and the wafer mark, is $\beta$, the angle formed between the light beam emerging from point b on the imaginary mask and the optical axis of the projection lens is $\theta_1'$ and the angle formed between the alignment light beam incident upon mask marks 41-1 and 41-2 and the optical axis of the projection lens is $\theta_R$.

Thereupon, distance D between imaginary mask 11-1 and mask 11 and distance 2r between two mask marks 41-1 and 41-2 have a correlation as follows:

$$r = D\tan\theta_1 = D\tan\beta\theta. \tag{1}$$

Pitch P of mask marks 41-1 and 41-2 are set as follows:

$$n\lambda/P = \sin\theta_R + \sin\theta_1 = \sin\theta_R + \sin\beta\theta,$$

where n is the order number of the diffracted light beams from the mask marks, and $\lambda$ is the wavelength of the alignment light beam. Thus, pitch P of the mask marks is set as if the ±1-order diffracted light beams from the mask marks were ones emerging from the imaginary mask.

In the second embodiment, moreover, the two ±1-order order diffracted light beams from the mask marks are focused on the wafer mark. However, these diffracted light beams need not be exactly focused, but only be focused within the depth of focusing. Also in this case, the ±1-order diffracted light beams interfere with each other, thereby forming an interference fringe. Thus, the distance between the mask and wafer may be somewhat varied.

Specifically, signal processing unit 48 may be arranged as follows. For example, it may be designed so that the mask or wafer 12 is oscillated horizontally at a predetermined frequency to modulate the alignment light beam, whereby the detection signals are synchronously demodulated in accordance with the predetermined frequency. Alternatively, unit 48 may be arranged so that the phase (or frequency) of the wavelength of the alignment light beam is modulated by mean of phase shift mechanism 52, whereby the detection signals are synchronously demodulated in accordance with the predetermined frequency.

Figure 7:
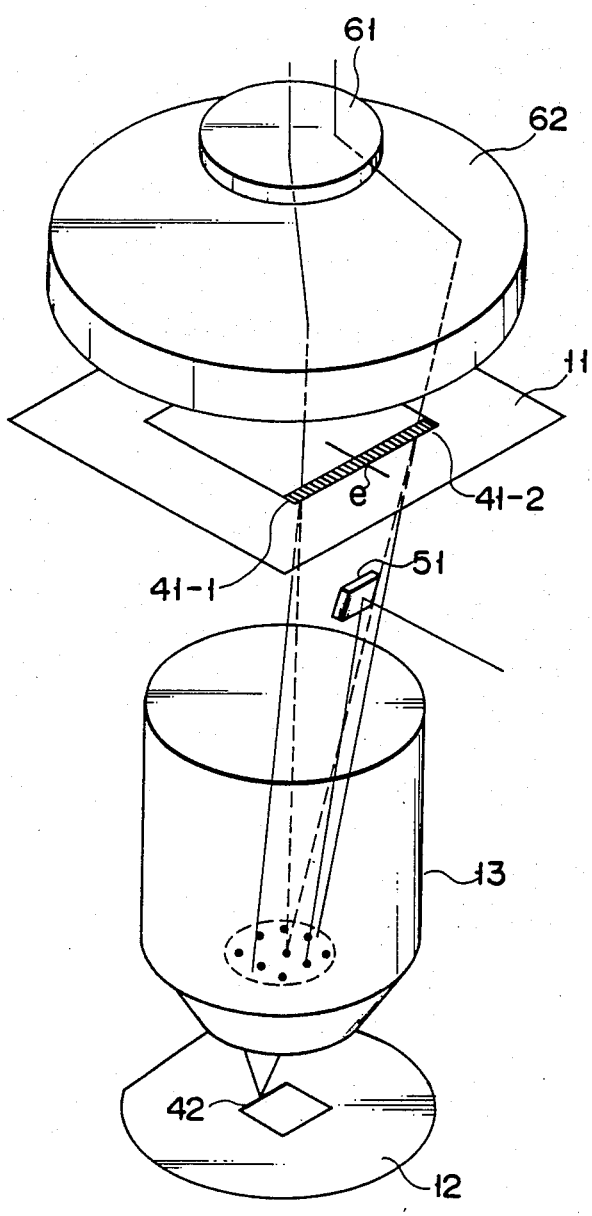
FIG. 7 is a perspective view of an aligning apparatus according to a third embodiment of the present invention.

Referring now to FIG. 7, a third embodiment of the present invention will be described.

This embodiment is a more specific version of the second embodiment.

Figure 8A:
FIGS. 8A, 8B, and 8C are plan views individually showing alignment marks.
Figure 8B:
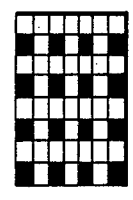
Figure 8C:
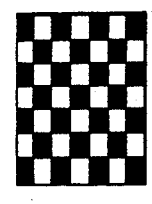

In the third embodiment, two alignment light beams are applied to mask marks 41-1 and 41-2 via lens 61 and condenser lens 62. In doing this, the alignment light beams are incident upon the mask marks so as to be directed toward the center of the incidence pupil of projection lens 13 (as indicated by broken line). Two ±1-order diffracted light beams from marks 41-1 and 41-2 are transmitted through the incidence pupil to be converged on wafer mark 42. As mentioned before, wafer mark 42 may be a one- (FIG. 8A) or two-dimensional diffraction grating (FIG. 8B) or checkered diffraction grating (FIG. 8C). The best selection depends on the operating conditions of a projection/exposure unit.

During transfer of a circuit pattern, for example, a mask and a wafer sometimes may be aligned with each other by means of an alignment light beam. In this case, a two-dimensional diffraction grating (FIG. 8B) or a checkered diffraction grating (FIG. 8C) may be used as a wafer mark. In the case of the embodiment shown in FIG. 6, the intensity of the re-diffracted light beams is more improved by employing the checkered diffraction grating for the wafer mark. Thus, re-diffracted light beams from the wafer mark are distributed in a two-dimensional manner. Among these re-diffracted light beams of the two-dimensional distribution, re-diffracted light beams of predetermined orders can be situated off the optical path of the exposure light beam. If mirror 51 is located so that the predetermined-order re-diffracted light beams can be detected, therefore, the exposure light beam cannot be intercepted by the mirror.

Whether wafer mark 42 is illuminated by the exposure light beam so that a resist of mark 42 is separated, or whether the wafer mark is not illuminated by the exposure light beam so that the resist remains unseparated, depends on a user's selection. In other words, the user can select the separation or retention of wafer mark 42 by forming a chromium-free window at point e of mask 11 which is conjugate to the wafer mark, or by depositing chromium to point e to intercept the exposure light beam.

Figure 9:
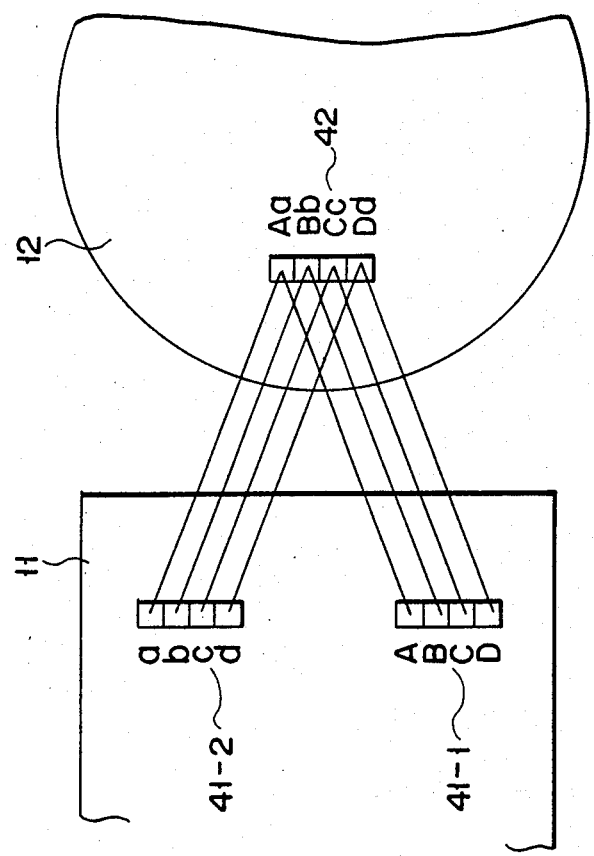
FIG. 9 is a plan view of a combination of a mask and a wafer, showing a modified arrangement of the alignment marks.

FIG. 9 shows modifications of the detecting means and the signal processing means.

In FIG. 9, mask 11 has four continuously arranged marks A, B, C and D, as mask marks 41-1, and four continuously arranged marks a, b, c and d, as mask marks 41-2. It is necessary only that marks A to D and a to d be arranged on a dicing line outside a circuit pattern. Marks A, B, C and D are spaced at a predetermined distance from marks a, b, c and d, respectively. In wafer 12, on the other, four marks Aa, Bb, Cc and Dd are continuously arranged as wafer marks. Thus, when the alignment light beam is applied to marks A and a of the wafer, diffracted light beams from these marks are transferred to mark Aa of the wafer to be diffracted thereby. Likewise, when the alignment light beam is applied to marks B and b (or C and c, or D and d), the diffracted light beams are transferred to mark Bb (or Cc or Dd) of the wafer.

The following three methods are available as signal processing methods using the marks described above.

According to the first method, the alignment beams incident on marks A and a are slightly oscillated in the alignment direction. Since the diffracted light reflected by the wafer also oscillates, a modulated detection signal is obtained as a result of the oscillation. This technique is similar to that used in the signal processings performed in an ordinary photoelectric microscope.

According to a second method, the alignment light beam is applied alternately to marks A and a and to marks B and b. As a result, re-diffracted light beams emerge alternately from marks Aa and Bb of the wafer. The pitch of mark Aa of the wafer is deviated from that of mark Bb by a quarter pitch. Therefore, the re-diffracted light beams from marks Aa and Bb are different in diffraction angle, so that they are detected independently of each other, or alternately. Then, the difference between these two re-diffracted light beams is calculated, and the mask and wafer are aligned so that the difference is zero.

According to the third method, the alignment beams are not oscillated. Instead, the right and left alignment beams are made to have a frequency difference of $\omega$ by means of frequency modulator 52, as is shown in FIG. 6. Since the re-interfered light coming from wafer mark 42 produces a beat signal resulting from frequency difference $\omega$, the position adjustment can be performed by measuring a phase change in the beat signal. (This method is generally referred to as an optical heterodyne method.)

When manufacturing a semiconductor device, a plurality of circuit patterns are transferred successively to one wafer. Accordingly, the mask and wafer must be aligned with each other every time a pattern is transferred. Thus, a number of alignment marks should be formed on the wafer. As shown in FIG. 9, for example, marks Aa and Bb of the wafer are used for the alignment for the transfer of a first layer, and marks Cc and Dd are used for the alignment for the transfer of a second layer. Let us suppose, however, that the alignment light beam is applied to marks A and a and marks B and b of the mask at the time of the transfer of the first layer. In this case, individual ±1-order diffracted light beams from marks A, a, B and b are transferred to marks Aa and Bb of the wafer. Possibly, however, 0-order diffracted light beams from marks A, a B and b may be illuminated to mark Cc or Dd of the wafer. In such a case, the 0-order diffracted light beams are reflected by mark Cc o Dd to be incident upon detector 47, so that the alignment is subject to an error. This error can be prevented by setting distance 2r between the mask marks relatively large so that angle $\theta$ at which the diffracted light beams from the mask marks are incident upon the wafer can be set relatively wide.

In the embodiments described above, the mirror is disposed between the mask and the wafer, whereby the re-diffracted light beams from the wafer mark are guided to the detector. Alternatively, however, as shown in FIG. 3 the mirror may be disposed in a manner such that the re-diffracted light beams from the wafer mark are guided to the detector after they are transferred to above the mask. Moreover, two wafer marks and one mask mark may be arranged on the wafer and the mask, respectively. As shown in FIG. 7, furthermore, the two mask marks may be in the form of one diffraction grating which extends relatively long.

What is claimed is:

1. A method for aligning first and second objects with each other, a projection lens disposed between the first and second objects, the first object having one first diffraction point, the second object having two second diffraction points spaced at a predetermined distance, said method comprising the steps of:

directing a light beam emitted from a light source to the first diffraction point so that two diffracted light beams emerge from the first diffraction point;

transferring the two diffracted light beams through the projection lens toward the two second diffraction points, the two diffracted light beams being converged by the projection lens and then being incident on the two second diffraction points, so that two re-diffracted light beams emerge respectively from the two second diffraction points;

detecting the two re-diffracted light beams, thereby obtaining a detection signal which corresponds to a displacement between the first and second objects; and aligning the first and second objects in accordance with the displacement.

2. A method according to claim 1, wherein respective optical axes of the two diffracted light beams, which are directed in an advancing direction of the diffracted light beams, intersect each other at an intersection point at a predetermined distance from the second object.

3. A method for aligning first and second objects with each other, a projection lens disposed between the first and second objects, the first object having one first diffraction point, the second object having two second diffraction points spaced at a predetermined distance, said method comprising the steps of:

directing a light beam emitted from a light source to the first diffraction point, so that two diffracted light beams emerge from the first diffraction point;

transferring the two diffracted light beams through the projection lens toward the two second diffraction points, the two diffracted light beams being converged by the projection lens and then being incident on the two second diffraction points, so that two re-diffracted light beams emerge respectively from the two second diffraction points;

interfering the two re-diffracted light beams with each other, thereby generating a light beat in the two re-diffracted light beams;

detecting the light beat, thereby obtaining a phase difference of the detected beat with respect to a reference beat, and the phase difference corresponding to a displacement between the first and second objects; and aligning the first and second objects in accordance with the displacement.

4. A method according to claim 3, wherein respective optical axes of the two diffracted light beams, which are directed in an advancing direction of the diffracted light beams, intersect each other at an intersection point at a predetermined distance from the second object.

5. A method according to claim 3, wherein respective directing step includes a step for generating two light beams of different frequencies and a step for directing the two light beams onto the first diffraction point.

6. A method for aligning first and second objects with each other, a projection lens disposed between the first and second objects, the first object having two first diffraction points spaced at a predetermined distance, the second object having two second diffraction points spaced at a predetermined distance, said method comprising the steps of:

directing two light beams emitted from a light source to the two first diffraction points so that two diffracted light beams emerge respectively from the two first diffraction points;

transferring the two diffracted light beams through the projection lens toward the two second diffraction points, the two diffracted light beams being converged by the projection lens and then being incident on the two second diffraction points, so that two re-diffracted light beams emerge respectively from the two second diffraction points;

interfering the two re-diffracted light beams with each other, thereby generating a light beat in the two re-diffracted light beams;

detecting the light beat, thereby obtaining a phase difference of the detected beat with respect to a reference beat, the phase difference corresponding to a displacement between the first and second objects; and aligning the first and second objects in accordance with the displacement.

7. A method according to claim 6, wherein respective optical axes of the two diffracted light beams, which are directed opposite to an advancing direction of the two diffracted light beams, intersect each other at an inspection point at a predetermined distance from the first object.

8. A method according to claim 6, wherein respective optical axes of the two diffracted light beams, which are directed in an advancing direction of the diffracted light beams, intersect each other at an intersection point at a predetermined distance from the second object.

9. A method according to claim 6, wherein said directing step includes a step for generating two light beams of different frequencies and a step for individually directing the two light beams onto the two first diffraction points.

10. A method for aligning first and second objects with each other, a projection lens disposed between the first and second objects, the first object having two first diffraction points spaced at a predetermined distance, the second object having one second diffraction point, said method comprising the steps of:

directing two light beams emitted from a light source to the two first diffraction points, so that two diffracted light beams emerge from the two first diffraction points;

transferring the two diffracted light beams through the projection lens toward the second diffraction points, the two diffracted light beams being forced on the second diffraction point by the projection lens, so that one re-diffracted and interfered light beam emerges from the second diffraction point;

detecting a light beat generated in the re-diffracted and interfered light beam, thereby obtaining a phase difference of the detected beat with respect to a reference beat, the phase difference corresponding to a displacement between the first and second objects; and aligning the first and second objects in accordance with the displacement.

11. A method according to claim 10, wherein respective optical axes of the two diffracted light beams, which are directed opposite to an advancing direction of the two diffracted light beams, intersect each other at an intersection point at a predetermined distance from the first object.

12. A method according to claim 10, wherein said directing step includes a step for generating two light beams of different frequencies and a step for individually directing the two light beams onto the two first diffraction points.

13. An apparatus for aligning first and second objects with each other, a projection lens disposed between the first and second objects, the first object having one first diffraction point, the second object having two second diffraction points spaced at predetermined distance, comprising:
   a light source for emitting an alignment light beam;
   means for directing the alignment light beam to the first diffraction point, so that two diffracted light beams emerge from the first diffraction point, the two diffracted light beams passing through the projection lens toward the two second diffraction points, being converted by the projection lens and then being incident on the two second diffraction points, so that two re-diffracted light beams emerge respectively from the two second diffraction points;
   means for detecting the re-diffracted light beams and generating a detection signal which corresponds to a displacement between the first and second objects; and
   means for adjusting said first and second objects relative to each other in response to the detection signal, thereby aligning said first and second objects with each other.

14. An apparatus according to claim 13, wherein respective optical axes of the two diffracted light beams, which are directed in an advancing direction of the diffracted light beam, intersect each other at an intersection point at a predetermined distance from the second object.

15. An apparatus for aligning first and second objects with each other, a projection lens disposed between the first and second objects, the first object having one first diffraction point, the second object having two second diffraction points spaced at a predetermined distance, comprising:
   a light source for emitting an alignment light beam;
   means for directing the alignment light beam to the first diffraction point, so that two diffracted light beams emerge from the first diffraction point, the two diffracted light beams passing through the projection lens toward the two second diffraction points, being converted by the projection lens and then being incident on the two second diffraction points, so that two re-diffracted light beams emerge respectively from the two second diffraction points;
   means for receiving the re-diffracted light beams and producing a beat signal which is generated by interfering the re-diffracted light beams with each other, thereby obtaining a phase difference of the heat signal with respect to a reverence beat signal, the phase difference corresponding to a displacement between the first and second objects; and
   means for adjusting said first and second objects relative to each other in accordance with the displacement, thereby aligning said first and second objects with each other.

16. An apparatus according to claim 15, wherein respective optical axes of the two diffracted light beams, which are directed in an advancing direction of the diffracted light beam, intersect each other at an intersection point at a predetermined distance from the second object.

17. An apparatus according to claim 15, wherein said alignment light beam directed on the first diffraction point includes two beams of different frequencies.

18. An apparatus for aligning first and second objects with each other, a projection lens disposed between the first and second objects, the first object having two first diffraction points, spaced at a predetermined distance, the second object having two second diffraction points spaced at a predetermined distance, comprising:
   means for emitting two alignment light beams;
   means for directing the two alignment light beams to the two first diffraction points, so that two diffracted light beams emerge respectively from the two first diffraction points, the two diffracted light beams passing through the projection lens toward the two second diffraction points, being converged by the projection lens and then being incident on the two second diffraction points, so that two re-diffracted light beams emerge respectively from the two second diffraction points;
   means for receiving the re-diffracted light beams and producing a beat signal which is generated by interfering the re-diffracted light beams with each other, thereby obtaining a phase difference of the heat signal with respect to a reverence beat signal, the phase difference corresponding to a displacement between the first and second objects; and
   means for adjusting said first and second objects relative to each other in accordance with the displacement, thereby aligning said first and second objects with each other.

19. An apparatus according to claim 18, wherein respective optical axes of the two diffracted light beams, which are directed opposite to an advancing direction of the diffracted light beam, intersect each other at an intersection point at a predetermined distance from the first object.

20. An apparatus according to claim 18, wherein respective optical axes of the two diffracted light beams, which are directed in an advancing direction of the diffracted light beam, intersect each other at an intersection point at a predetermined distance from the second object.

21. The apparatus according to claim 18, wherein each of said alignment light beams directed on the two second diffraction points includes two beam having different frequencies.

22. An apparatus for aligning first and second objects with each other, a projection lens disposed between the first and second objects, the first object having two first diffraction points, spaced at a predetermined distance, the second object having one second diffraction point comprising:
   means for emitting two alignment light beams;
   means for directing the two alignment light beams to the two first diffraction points, so that two diffracted light beams emerge respectively from the two first diffraction points, the two diffracted and interfered light beams passing through the projection lens toward the second diffraction point, and forced on the second diffraction point by the projection lens, so that one re-diffracted light beam emerges from the second diffraction point;
   means for receiving the re-diffracted light beam and producing a beat signal which is generated by interfering light beams with each other, thereby obtaining a phase difference of the heat signal with respect to a reverence beat signal, the phase difference corresponding to a displacement between the first and second objects; and means for adjusting said first and second objects relative to each other in accordance with the displacement, thereby aligning said first and second objects with each other.

23. An apparatus according to claim 22, wherein respective optical axes of the two diffracted light beams, which are directed opposite to an advancing direction of the two diffracted light beams, intersect each other at an intersection point at a predetermined distance from the first object.

24. An apparatus according to claim 22, wherein each of said alignment light beams directed on the two first diffraction points includes two beams having different frequencies.

* * * * *